(12) United States Patent
Yeh et al.

(10) Patent No.: US 9,373,508 B2
(45) Date of Patent: Jun. 21, 2016

(54) SEMICONDUCTOR DEVICE AND FABRICATING METHOD THEREOF

(71) Applicant: REALTEK SEMICONDUCTOR CORPORATION, Hsinchu (TW)

(72) Inventors: Ta-Hsun Yeh, Hsinchu (TW); Hui-Min Huang, New Taipei (TW); Yuh-Sheng Jean, Hsinchu County (TW)

(73) Assignee: Realtek Semiconductor Corporation, Hsinchu (TW)

( * ) Notice: Subject to any disclaimer, the term of this patent is extended or adjusted under 35 U.S.C. 154(b) by 15 days.

(21) Appl. No.: 13/954,726

(22) Filed: Jul. 30, 2013

(65) Prior Publication Data
US 2014/0035049 A1     Feb. 6, 2014

(30) Foreign Application Priority Data

Jul. 31, 2012  (TW) .............................. 101127545 A

(51) Int. Cl.
| H01L 21/70 | (2006.01) |
| H01L 21/265 | (2006.01) |
| H01L 27/088 | (2006.01) |
| H01L 21/8234 | (2006.01) |
| H01L 29/66 | (2006.01) |
| H01L 29/78 | (2006.01) |

(52) U.S. Cl.
CPC ........ *H01L 21/265* (2013.01); *H01L 21/26586* (2013.01); *H01L 21/823412* (2013.01); *H01L 27/088* (2013.01); *H01L 29/6659* (2013.01); *H01L 29/7833* (2013.01)

(58) Field of Classification Search
CPC ..................... H01L 21/265; H01L 21/823412; H01L 21/26586
USPC .......................................................... 257/368
See application file for complete search history.

(56) References Cited

U.S. PATENT DOCUMENTS

| 2001/0046740 | A1* | 11/2001 | Kim et al. ...................... 438/275 |
| 2007/0194392 | A1* | 8/2007 | Travis et al. .................. 257/394 |
| 2007/0235817 | A1 | 10/2007 | Wang et al. |
| 2008/0179691 | A1* | 7/2008 | Benaissa et al. ............. 257/391 |
| 2009/0170259 | A1* | 7/2009 | Hornung et al. ............. 438/231 |
| 2011/0171795 | A1 | 7/2011 | Tsai et al. |

FOREIGN PATENT DOCUMENTS

| CN | 101055872 A | 10/2007 |
| TW | 200520142 | 6/2005 |
| TW | 201125043 A1 | 7/2011 |

* cited by examiner

*Primary Examiner* — Douglas Menz

(57) ABSTRACT

A semiconductor device and a fabricating method thereof are provided. The semiconductor device is formed on a substrate and includes a first first-type metal-oxide-semiconductor field effect transistor (MOSFET) and a second first-type MOSFET. The first first-type MOSFET includes a first gate structure, a first source area and a first drain area on the substrate. The second first-type MOSFET includes a second gate structure, a second source area, and a second drain area on the substrate. A first pocket implant process is applied to the first first-type MOSFET via a first photomask, while a second pocket implant process is applied to the second first-type MOSFET via a second photomask. The first and second gate structures are facing different directions.

10 Claims, 8 Drawing Sheets

US 9,373,508 B2

SEMICONDUCTOR DEVICE AND FABRICATING METHOD THEREOF

This application claims priority to Taiwan Patent Application No. 101127545 filed on Jul. 31, 2012, which is hereby incorporated by reference in its entirety.

CROSS-REFERENCES TO RELATED APPLICATIONS

Not applicable.

BACKGROUND OF THE INVENTION

1. Field of the Invention

The present invention provides a semiconductor device and a fabricating method thereof. More particularly, the present invention provides a semiconductor device with a pocket implant or halo implant technology and a fabricating method thereof.

2. Descriptions of the Related Art

With the evolution of semiconductor manufacturing technologies, semiconductor devices have gradually become smaller with higher densities. However, semiconductor devices with smaller sizes unfortunately are prone to the short channel effect.

Pocket implant or halo implant technology is an approach that is commonly used to improve the short channel effect. FIG. 1A depicts a top view of a conventional semiconductor device 1, while FIG. 1B depicts a schematic cross-sectional view of the conventional semiconductor device 1 taken along a reference line 14. The semiconductor device 1 comprises a substrate 10, a gate structure 11, a source area 12, and a drain area 13. The gate structure 11 comprises a dielectric layer 11a and a gate electrode 11b. According to the conventional pocket implant or halo implant technology, a pocket implant process is applied to the semiconductor device 1 from four directions 10a, 10b, 10c, and 10d. First, ion implantation conditions are set and angles for ion implantations are fixed. Afterwards, via the same photomask, the pocket implant process begins from one of the four directions 10a, 10b, 10c, and 10d (e.g., the direction 10a). The substrate 10 is then rotated horizontally by 90° so that the pocket implant process is applied from a next direction (e.g., the direction 10c), etc. The pocket process proceeds until all the four directions have been applied. Here, the pocket implant process is applied in the directions 10c and 10d for the gate electrode 11b of the semiconductor device 1 and applied in the directions 10a and 10b for a gate electrode (not shown) of another semiconductor device perpendicular to the gate electrode 11b.

As can be known from FIG. 1B, after the pocket implant process is applied to the semiconductor device 1 in the directions 10c and 10d, pocket implant areas 15, 16 are formed at the inner edges of the source area 12 and the drain area 13 respectively. The pocket implant areas 15, 16 can reduce the transverse electric field between the source area 12 and the substrate 10, as well as the transverse electric field between the drain area 13 and the substrate 10, thereby, improving the short channel effect.

However, as semiconductor manufacturing technologies advance into the nanometer (nm) generation (i.e., generations of 100 nm and below), the problem of device mismatch derived from the pocket implant process applied to the semiconductor device becomes more prevalent. Usually, a compromise can be made between the short channel effect and the device mismatch by adjusting the ion implant dose, the ion implant energy, or the thermal process or by adopting a co-implant process. Nevertheless, as the manufacturing processes advance to increasingly smaller device sizes (e.g., 40 nm and below), the effect thus achieved is very limited.

In view of this, it is important to provide a solution that can provide a compromise between the short channel effect and the device mismatch as manufacturing processes become increasingly smaller (e.g., 40 nm and below).

SUMMARY OF THE INVENTION

As addressed, the technology provided by the prior art applies the pocket implant process to the gate electrode 11b of the semiconductor device 1 to form the pocket implant areas 15 and 16. The pocket implant process applied in the directions 10c and 10d will result in device mismatch or with other adverse effects on the gate electrode of the other semiconductor device perpendicular to the gate electrode 11b. Similarly, the pocket implant process applied in the directions 10a and 10b will also have negative impacts on the device characteristics of the gate electrode 11b (the semiconductor device 1).

Therefore, the technology provided by the present invention applies the pocket implant process (e.g., in the directions 10c and 10d) to a gate electrode which parallel the gate electrode of the semiconductor device (e.g., a first-type metal-oxide-semiconductor field effect transistor (MOSFET)) via a photomask. In this way, however, the gate electrodes can only be placed parallel to each other, which is unfavorable for reducing the layout area and improving the utilization ratio of the wafer. Therefore, the technology provided by the present invention apply the pocket implant process (e.g., in the directions 10a and 10b) to a gate electrode that has a direction different from (e.g., perpendicular to) that of the aforementioned gate electrode of the semiconductor device, via another photomask to further solve the aforesaid problems of the prior art.

Therefore, the present invention provides a semiconductor device and a fabricating method for forming a semiconductor device.

The semiconductor device of the present invention is formed on a substrate and comprises a first first-type metal-oxide-semiconductor field effect transistor (MOSFET) and a second first-type MOSFET. The first first-type MOSFET has a first gate structure, a first source area, and a first drain area formed on the substrate. The second first-type MOSFET has a second gate structure, a second source area, and a second drain area formed on the substrate. The first pocket implant process is applied to the first first-type MOSFET via a first photomask and a second pocket implant process is applied to the second first-type MOSFET via a second photomask. A direction of the first gate structure and a direction of the second gate structure are different.

The fabricating method for forming a semiconductor device on a substrate according to the present invention comprises the following steps: (a) forming a first first-type MOSFET with a first gate structure, a first source area, and a first drain area on the substrate, (b) forming a second first-type MOSFET with the second gate structure, a second source area, and a second drain area on the substrate, (c) applying the first pocket implant process to the first first-type MOSFET via a first photomask, and (d) applying a second pocket implant process to the second first-type MOSFET via a second photomask. It is noted that a direction of the first gate structure and a direction of the second gate structure are different.

The fabricating method for forming a semiconductor device according to the present invention form two gate structures of different directions on a substrate and apply the pocket implant processes to two sides of each of the gate structures via two different photomasks respectively so that pocket implant areas are formed at the edges of the source areas and the drain areas. Since the pocket implant processes are applied only to the two sides of each of the gate structures, the problem of mismatch of the devices can be eased. Furthermore, since the directions of the gate structures are not required to be the same, the entire layout area can be reduced and the utilization ratio of the wafer can be improved.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, the semiconductor device and the fabricating method thereof of the present invention will be explained with reference to embodiments thereof. However, these embodiments are not intended to limit the present invention to any specific environment, applications or particular implementations described in these embodiments. Therefore, the description of these embodiments is only for the purpose of illustration rather than to limit the present invention. It should be appreciated that in the following embodiments and the attached drawings, elements and procedures unrelated to the present invention may be omitted from depiction.

Figure 1A:
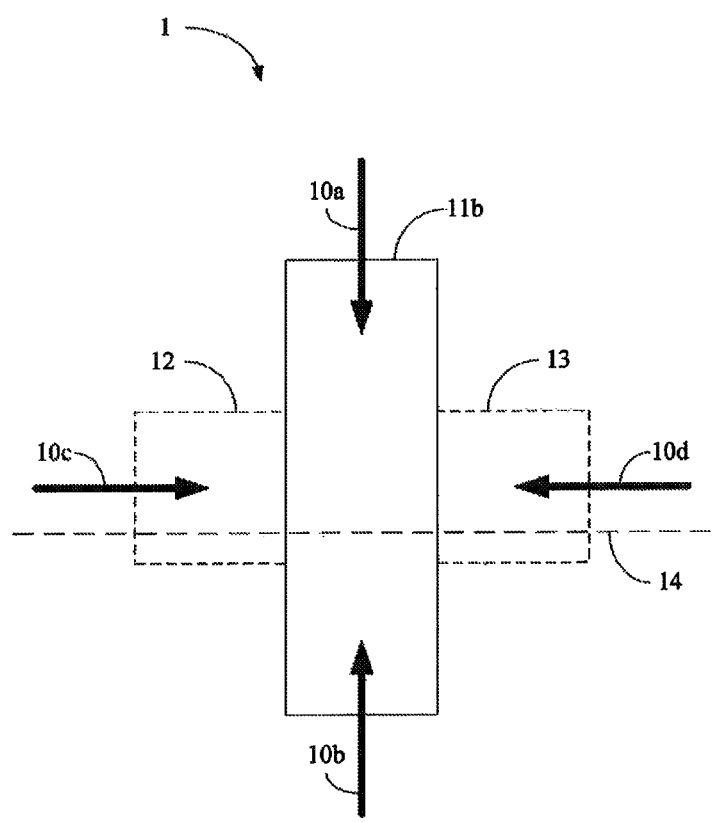
FIG. 1A depicts a top view of a conventional semiconductor device.
Figure 1B:
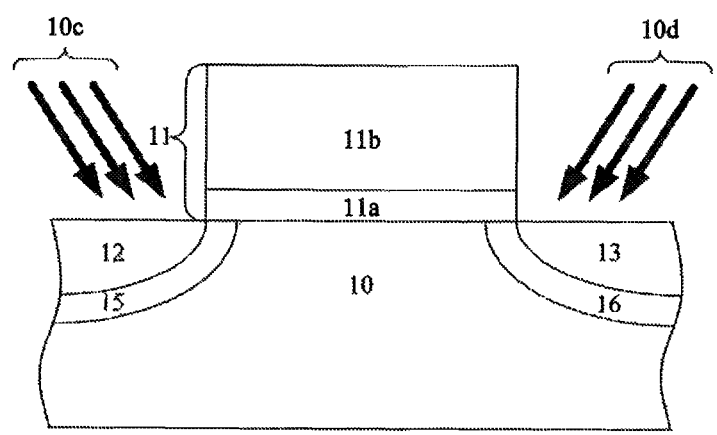
FIG. 1B depicts a schematic cross-sectional view of the conventional semiconductor device taken along a reference line 14.
Figure 2A:
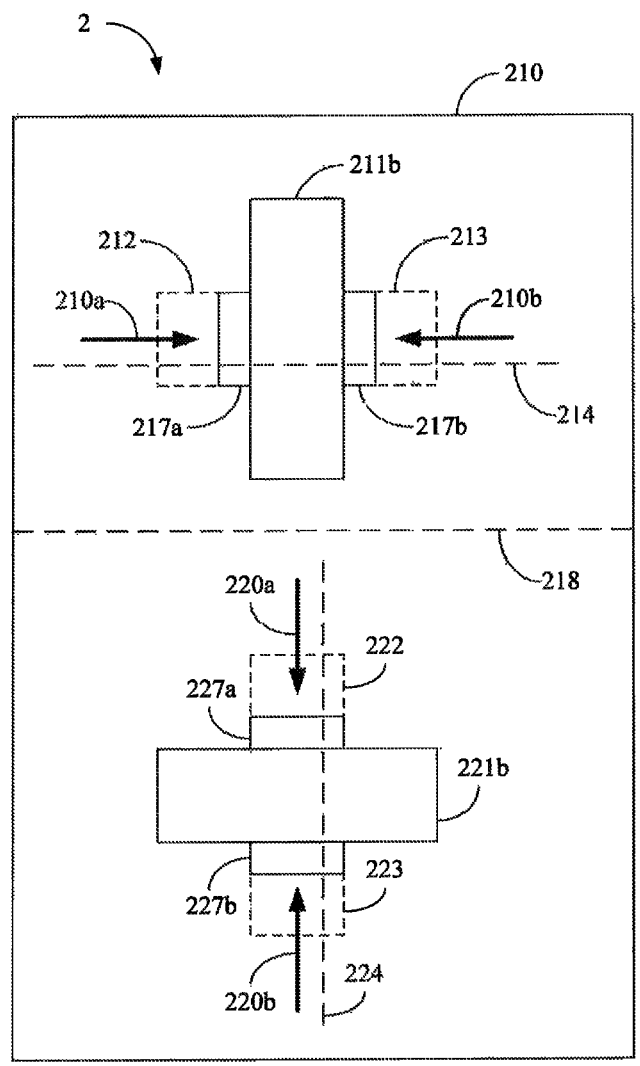
FIG. 2A depicts a top view of a semiconductor device according to a first embodiment of the present invention.
Figure 2B:
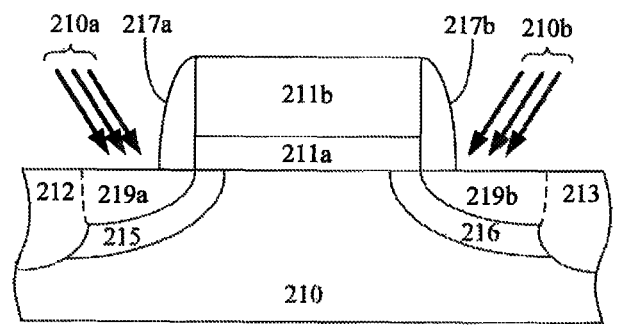
FIG. 2B depicts a schematic cross-sectional view of the semiconductor device according to the first embodiment taken along a reference line 214.
Figure 2C:
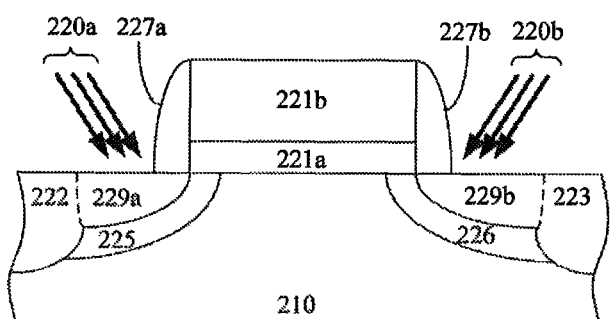
FIG. 2C depicts a schematic cross-sectional view of the semiconductor device according to the first embodiment taken along a reference line 224.

FIGS. 2A, 2B, and 2C illustrate a semiconductor device 2 of a first embodiment of the present invention. FIG. 2A depicts a top view of the semiconductor device 2, FIG. 2B depicts a schematic cross-sectional view of the semiconductor device 2 taken along a reference line 214, and FIG. 2C depicts a schematic cross-sectional view of the semiconductor device 2 taken along a reference line 224.

The semiconductor device 2 comprises a substrate 210, a first gate structure, first sidewall spacers 217a and 217b, a first source area 212, a first drain area 213, first lightly-doped areas 219a and 219b, first pocket implant areas 215 and 216, a second gate structure, second sidewall spacers 227a and 227b, a second source area 222, a second drain area 223, second lightly-doped areas 229a and 229b, and second pocket implant areas 225 and 226. It is noted that the first gate structure, the first source area 212, and the first drain area 213 form the main body of a first first-type metal-oxide-semiconductor field effect transistor (MOSFET), while the second gate structure, the second source area 222, and the second drain area 223 form the main body of a second first-type MOSFET. Please note that the figures are for illustration, and practically the spaces may be located around the gates. Please also note that practically the sources or drains may be located more close to the gates and even partially under the gates.

The first gate structure and the second gate structure are formed in a first region and a second region on the substrate 210 respectively. In FIG. 2A, above the reference line 218 is the first region and below the reference line 218 is the second region. The first gate structure comprises a first dielectric layer 211a and a first gate electrode 211b, while the second gate structure comprises a second dielectric layer 221a and a second gate electrode 221b. It should be appreciated that the first gate structure and the second gate structure are in different directions (i.e., the first gate electrode 211b and the second gate electrode 221b are placed in different directions on the substrate 210). In a preferred implementation, the direction of the first gate structure placed on the substrate 210 and the direction of the second gate structure placed on the substrate 210 form 90 degrees as shown by the first gate electrode 211b and the second gate electrode 221b in FIG. 2A.

Subsequently, a first pocket implant process is applied to the first first-type MOSFET via a first photomask. In particular, the first photomask (not shown) is placed to cover the second region (i.e., the region below the reference line 218) and other unrelated regions. Thereafter, a lightly-doped implant process and a pocket implant process are adopted in the first embodiment sequentially to apply the lightly-doped implant and the pocket implant from two directions 210a and 210b. By this lightly-doped implant process, the first lightly-doped implant areas 219a and 219b are formed at two sides below the first gate structure respectively within the substrate 210. Furthermore, by this pocket implant process, the first pocket implant areas 215 and 216 are formed at the inner edges of the first lightly-doped areas 219a and 219b respectively within the substrate 210.

In detail, the aforesaid pocket implant process may be accomplished by firstly applying the pocket implant process from the direction 210a and then rotating the substrate 210 horizontally by 180° so that the pocket implant process is applied from the direction 210b, thus, forming the first pocket implant areas 215 and 216. It should be appreciated that, in other implementations, the pocket implant process may be applied firstly from the direction 210b and then from the direction 210a.

Subsequently, a second pocket implant process is applied to the second first-type MOSFET via a second photomask. In particular, the second photomask (not shown) is placed to cover the first region (i.e., the region above the reference line 218) and other unrelated regions. Thereafter, a lightly-doped implant process and a pocket implant process are adopted to apply the lightly-doped implant and the pocket implant from two directions 220a and 220b. By this lightly-doped implant process, the second lightly doped areas 229a and 229b are formed at the two sides below the second gate structure respectively within the substrate 210. Furthermore, by this pocket implant process, the second pocket implant areas 225 and 226 are formed at the inner edges of the second lightly-doped implant areas 229a and 229b respectively within the substrate 210.

In detail, the aforesaid pocket implant process may be accomplished by firstly applying the pocket implant process from the direction 220a and then rotating the substrate 210 horizontally by 180° so that the pocket implant process is applied from the direction 220b, thus, forming the second pocket implant areas 225 and 226. It should be appreciated that in other implementations, the pocket implant process may be applied firstly from the direction 220b and then from the direction 220a.

Subsequently, the first sidewall spacers 217a and 217b are formed at two sides of the first gate structure respectively on the substrate 210. In addition, the second sidewall spacers 227a and 227b are formed at two sides of the second gate structure respectively on the substrate 210. Thereafter, by a source area implant process and a drain implant process, the first source area 212 and the first drain area 213 are formed outside the first lightly-doped implant areas 219a and 219b within the substrate 210 respectively. Similarly, by a source area implant process and a drain implant process, the second source area 222 and the second drain area 223 are formed outside the first lightly-doped implant areas 229a and 229b within the substrate 210 respectively.

In an embodiment, the angle in which the pocket implant process is applied via the first photomask and the angle in which the second pocket implant process is applied via the second photomask substantially form an angle of 90 degrees. Furthermore, in an embodiment, the first gate structure and the second gate structure are formed by doping the same type of ions. In particular, if the first gate structure, the first source area 212, the first drain area 213, the first lightly-doped implant areas 219a and 219b, the second gate structure, the second source area 222, the second drain area 223, and the second lightly-doped implant areas 229a and 229b are formed by doping first-type ions, then the first pocket implant areas 215 and 216 and the second pocket implant areas 225 and 226 are formed by doping second-type ions. The first-type ions may be either P-type ions or N-type ions, while the second-type ions may be either P-type ions or N-type ions.

As can be known from the above description, two gate structures of different directions the first gate structure and the second gate structure) are formed on the semiconductor device 2 of the first embodiment. Since the first gate structure and the second gate structure are placed in different directions, the entire layout area is reduced. Furthermore, since the pocket implant process is applied to two sides of each of the first gate structure and the second gate structure (i.e, two sides of a first channel formed by the first gate structure, the first source area 212 and the first drain area 213 and two sides of a second channel formed by the second gate structure, the second source area 222 and the second drain area 223), the problem of mismatch in the semiconductor device 2 can be eased.

Figure 3:
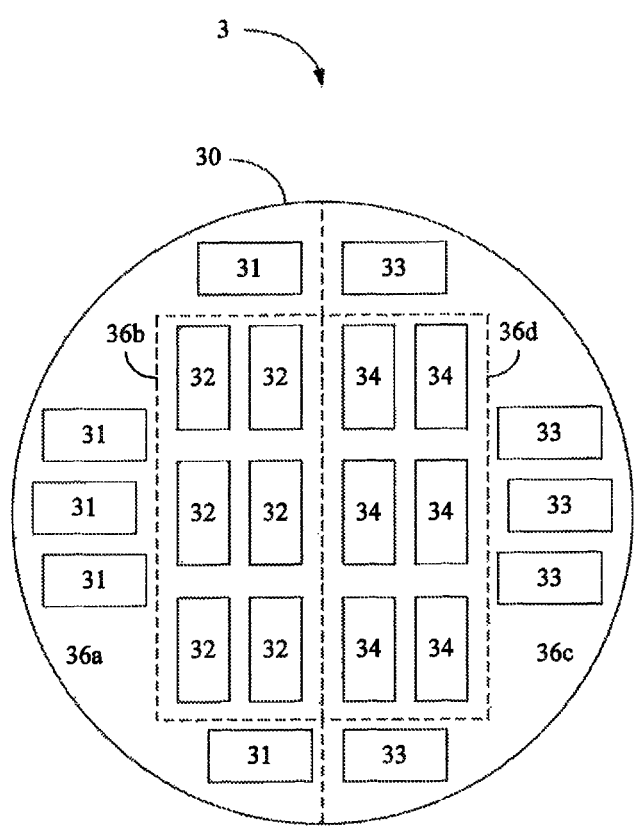
FIG. 3 depicts an exemplary wafer 3 according to a second embodiment of the present invention.

The second embodiment of the present invention is an exemplary wafer 3, a top view of which is depicted in FIG. 3. First, a plurality of first N-type gate structures 31, a plurality of second N-type gate structures 32, a plurality of first P-type gate structures 33, and a plurality of second P-type gate structures 34 are formed in regions 36a, 36b, 36c and 36d on a substrate 30 respectively. The direction of the N-type gate structures 31 and the direction of the N-type gate structures 32 form an angle of 90 degrees, while the direction of the P-type gate structures 33 and the direction of the P-type gate structures 34 form an angle of 90 degrees.

Subsequently, a photomask is placed to cover the regions 36b, 36c, and 36d. Next, a lightly-doped implant process is applied to form lightly-doped implant areas (not shown) of N-type ions at two sides below each of the first N-type gate structures 31 within the substrate 30 and a pocket implant process is applied to form pocket implant areas (not shown) of P-type ions at the inner edges of the aforesaid lightly-doped implant areas.

Similarly, a photomask is placed to cover the regions 36a, 36c, 36d and other unrelated regions. Next, a lightly-doped implant process is applied to form lightly-doped implant areas (not shown) of N-type ions at two sides below each of the second N-type gate structures 32 within the substrate 30 and a pocket implant process is applied to form pocket implant areas (not shown) of P-type ions at the inner edges of the aforesaid lightly-doped implant areas.

Thereafter, a photomask is placed to cover the regions 36a, 36b, 36d and other unrelated regions. Afterwards, a lightly-doped implant process is applied to form lightly-doped implant areas (not shown) of P-type ions at two sides below each of the first P-type gate structures 33 within the substrate 30 and a pocket implant process is applied to form pocket implant areas (not shown) of N-type ions at inner edges of the aforesaid lightly-doped implant areas.

Similarly, a photomask is placed to cover the regions 36b, 36c and 36d. Then, a lightly-doped implant process is applied to form lightly-doped implant areas (not shown) of P-type ions at two sides below each of the second P-type gate structures 34 within the substrate 30 and a pocket implant process is applied to form pocket implant areas (not shown) of N-type ions at the inner edges of the aforesaid lightly-doped implant areas.

Sidewall spacers are then formed at two sides of each of the first N-type gate structures 31, two sides of each of the second N-type gate structures 32, two sides of each of the first P-type gate structures 33, and two sides of each of the second P-type gate structures on the substrate 30. Thereafter, a photomask is placed to cover the regions 36c and 36d to form source areas and drain areas outside the lightly-doped implant areas of the first N-type gate structures 31 and the second N-type gate structures 32 within the substrate 30. Similarly, a photomask is placed to cover the regions 36a and 36b to form source areas and drain areas outside the lightly-doped implant areas of the first P-type gate structures 33 and the second P-type gate structures 34 within the substrate 30.

Through the above procedures, N-Type Metal-Oxide-Semiconductor Field-Effect Transistors (NMOSs) of different directions and P-Type Metal-Oxide-Semiconductor Field-Effect Transistors (PMOSs) of different directions are formed on the exemplary wafer 3 of the second embodiment, so the entire layout area is reduced and the space of the wafer 3 can be utilized efficiently. When gate structures can only be arranged in a single direction on one wafer or a region with a small area, the utilization ratio of the wafer or the area is limited. For gate structures of 40 nm and below, when the gate structures are arranged in different directions by use of different photomasks, the utilization ratio of the wafer or the area can be greatly improved.

Figure 4A:
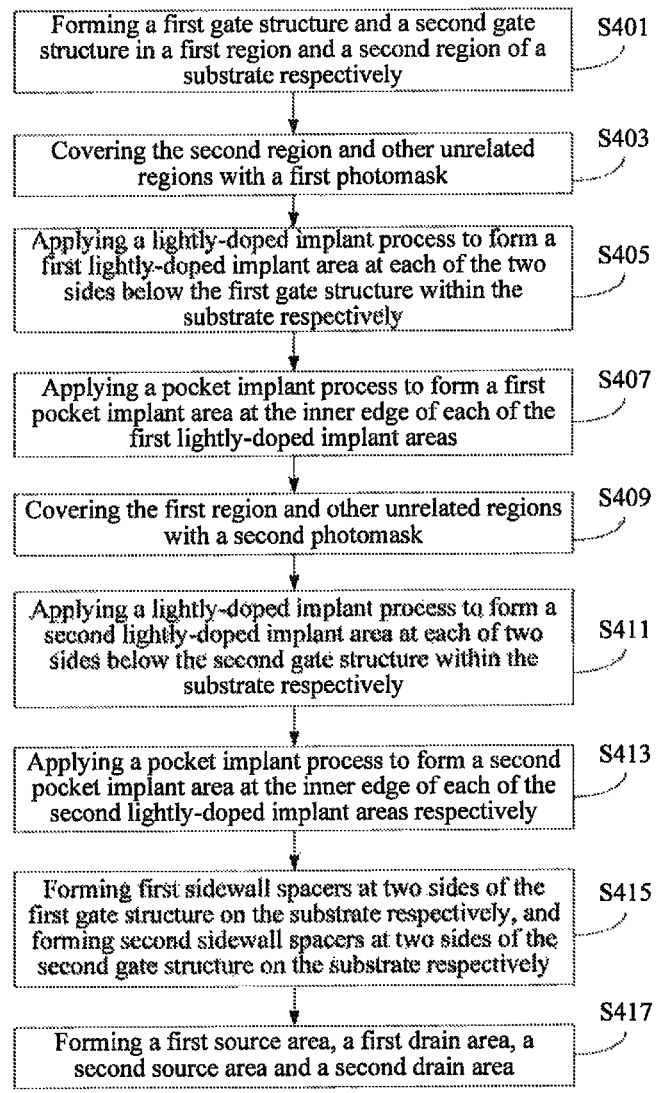
FIGS. 4A, 4B and 4C depict flowchart diagrams according to a third embodiment of the present invention.
Figure 4B:
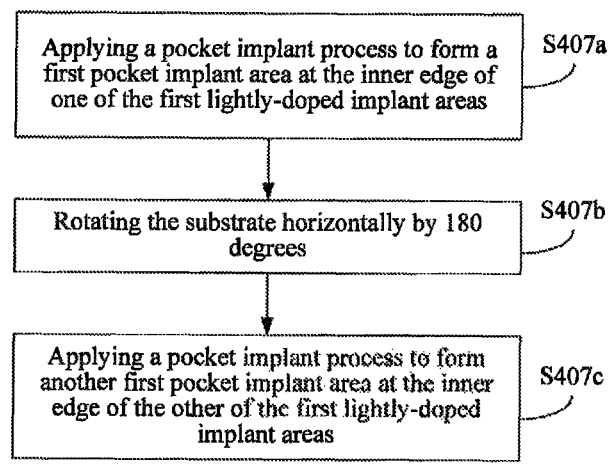
Figure 4C:
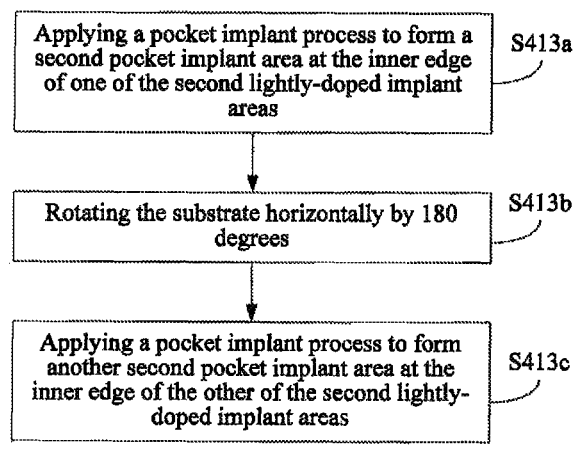

A third embodiment of the present invention is a fabricating method for forming a semiconductor device, a flowchart diagram of which is depicted in FIGS. 4A, 4B, and 4C.

First, step S401 is executed to form a first gate structure and a second gate structure in a first region and a second region of a substrate respectively. It should be appreciated that the direction of the first gate structure and the direction of the second gate structure are different. In preferable implementations, the direction of the first gate structure and the direction of the second gate structure form an angle of 90 degrees.

Subsequently, step S403 is executed to cover the second region and other unrelated regions with a first photomask. In step S405, a lightly-doped implant process is applied to form a first lightly-doped implant area at each of the two sides below the first gate structure within the substrate respectively. Thereafter, in step S407, a pocket implant process is applied to form a pocket implant area at the inner edge of each of the first lightly-doped implant areas.

Furthermore, step S407 may be accomplished by steps S407a, S407b, and S407c. In step S407a, a pocket implant process is applied to form a first pocket implant area at the inner edge of one of the first lightly-doped implant areas. Subsequently, the substrate is rotated horizontally by 180° in step S407b. Then, in step S407c, a pocket implant process is applied to form another first pocket implant area at the inner edge of the other of the first lightly-doped implant areas.

Thereafter, step S409 is executed to cover the first region and other unrelated regions with a second photomask. After the second photomask has been formed, step S411 is executed to apply a lightly-doped implant process to form a second lightly-doped implant area at each of two sides below the second gate structure within the substrate respectively. Subsequently, step S413 is executed to apply a pocket implant process to form a second pocket implant area at the inner edge of each of the second lightly-doped implant areas respectively. In preferable implementations, the angle in which the pocket implant process is applied in step S413 and the angle in which the pocket implant process is applied in step S407 substantially include an angle of 90 degrees therebetween.

Furthermore, step S413 may be accomplished by steps S413a, S413b and S413c. In step S413a, a pocket implant process is applied to form a second pocket implant area at the inner edge of one of the second lightly-doped implant areas. Subsequently, the substrate is rotated horizontally by 180° in step S413b. Then, in step S413c, a pocket implant process is applied to form another second pocket implant area at the inner edge of the other of the second lightly-doped implant areas.

Thereafter, in step S415, first sidewall spacers are formed at two sides of the first gate structure on the substrate respectively, and second sidewall spacers are formed at two sides of the second gate structure on the substrate respectively. Subsequently in step S417, a source area implant process and a drain implant process are applied to form a first source area and a first drain area outside the first lightly-doped implant areas within the substrate and to form a second source area and a second drain area outside the second lightly-doped implant areas within the substrate.

The aforesaid first gate structure, the first source area, and the first drain area form the main body of a first first-type MOSFET, while the second gate structure, the second source area, and the second drain area form the main body of a second first-type MOSFET. The aforesaid step S407 may be considered to apply the first pocket implant process to the first first-type MOSFET via the first photomask. Furthermore, the first pocket implant process is applied to two sides of the first channel which formed by the first gate structure, the first source area and the first drain area. Similarly, the aforesaid step S413 may be considered to apply the second pocket implant process to the second first-type MOSFET via the second photomask. Furthermore, the second pocket implant process is applied to two sides of the second channel formed by the second gate structure, the second source area and the second drain area.

Furthermore, in an embodiment, the first gate structure and the second gate structure are formed by doping the same type of ions. In particular, if the first gate structure, the first lightly-doped implant areas, the first source area, the first drain area, the second gate structure, the second lightly-doped implant areas, the second source area and the second drain area are formed by doping first-type ions, then the first pocket implant areas and the second pocket implant areas are formed by doping second-type ions. The first-type ions may be either P-type ions or N-type ions, while the second-type ions may be either P-type ions or N-type ions.

Through the fabricating method for forming a semiconductor device according to the present invention, the gate structures of two different directions can be formed on a substrate, and then through the use of two photomasks, a pocket implant process is applied to two sides of each of the gate structures so that the pocket implant areas are formed below the source area and the drain area. Since the pocket implant process is applied only to the two sides of each of the gate structures (in other words, two sides of each of the channels), the problem of device mismatch can be eased. Furthermore, since the directions of the gate structures are not required to be the same, the entire layout area is reduced and the utilization ratio of the wafer is improved.

Since there may be many procedures in the semiconductor manufacturing process, the embodiments described above are only intended to illustrate the implementations of the present invention and explain the technical features of the present invention rather than to limit the scope of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor device, being formed on a substrate and comprising:
   a first first-type metal-oxide-semiconductor field effect transistor (MOSFET), having a first gate structure, a first source area, a first drain area, and two first pocket implant areas formed on the substrate; and
   a second first-type MOSFET, having a second gate structure, a second source area, and a second drain area, and two second pocket implant areas formed on the substrate;
   wherein a first pocket implant process is applied to the first first-type MOSFET via a first photomask to form the two first pocket implant areas, a second pocket implant process is applied to the second first-type MOSFET via a second photomask to form the two second pocket implant areas, and a direction of the first gate structure and a direction of the second gate structure are different.

2. The semiconductor device of claim 1, wherein the direction of the first gate structure and the direction of the second gate structure substantially form 90 degrees.

3. The semiconductor device of claim 1, wherein the first pocket implant process is applied to two sides of a first channel formed by the first gate structure, the first source area, and the first drain area.

4. The semiconductor device of claim 3, wherein the second pocket implant process is applied to two sides of a second channel formed by the second gate structure, the second source area, and the second drain area.

5. The semiconductor device of claim 4, wherein an angle for applying the first pocket implant process and an angle for applying the second pocket implant process substantially form 90 degrees.

6. A fabricating method for forming a semiconductor device on a substrate, comprising the following steps of:
   forming a first first-type MOSFET on the substrate, the first first-type MOSFET having a first gate structure, a first source area, and a first drain area;
   forming a second first-type MOSFET on the substrate, the second first-type MOSFET having a second gate structure, a second source area, and a second drain area;

applying a first pocket implant process to the first first-type MOSFET via a first photomask to form two first pocket implant areas on the substrate; and applying a second pocket implant process to the second first-type MOSFET via a second photomask two second pocket implant areas formed on the substrate;

wherein a direction of the first gate structure and a direction of the second gate structure are different.

7. The fabricating method of claim 6, wherein the direction of the first gate structure and the direction of the second gate structure substantially form 90 degrees.

8. The fabricating method of claim 6, wherein the first pocket implant process is applied to two sides of a first channel formed by the first gate structure, the first source area, and the first drain area.

9. The fabricating method of claim 8, wherein the second pocket implant process is applied to two sides of a second channel formed by the second gate structure, the second source area, and the second drain area.

10. The fabricating method of claim 9, wherein an angle for applying the first pocket implant process via the first photomask and an angle for applying the second pocket implant process via the second photomask substantially form 90 degrees.

* * * * *